(12) United States Patent
Sheng et al.

(10) Patent No.: US 10,047,440 B2
(45) Date of Patent: Aug. 14, 2018

(54) METHODS AND APPARATUS FOR UNIFORMLY AND HIGH-RATE DEPOSITING LOW RESISTIVITY MICROCRYSTALLINE SILICON FILMS FOR DISPLAY DEVICES

(71) Applicant: Applied Materials, Inc., Santa Clara, CA (US)

(72) Inventors: Shuran Sheng, Saratoga, CA (US); Su Ho Cho, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 145 days.

(21) Appl. No.: 15/256,054

(22) Filed: Sep. 2, 2016

(65) Prior Publication Data

US 2017/0069493 A1    Mar. 9, 2017

Related U.S. Application Data

(60) Provisional application No. 62/214,781, filed on Sep. 4, 2015.

(51) Int. Cl.

| | |
|---|---|
| *C23C 16/52* | (2006.01) |
| *H01L 21/02* | (2006.01) |
| *C23C 16/24* | (2006.01) |
| *C23C 16/455* | (2006.01) |
| *C23C 16/515* | (2006.01) |

(Continued)

(52) U.S. Cl.
CPC .............. *C23C 16/52* (2013.01); *C23C 16/24* (2013.01); *C23C 16/45523* (2013.01); *C23C 16/45565* (2013.01); *C23C 16/5096* (2013.01); *C23C 16/515* (2013.01); *H01J 37/32* (2013.01); *H01J 37/32146* (2013.01); *H01J 37/32357* (2013.01); *H01J 37/32449* (2013.01);

(Continued)

(58) Field of Classification Search
CPC . C23C 16/52; C23C 16/24; C23C 16/485523; C23C 16/45565; C23C 16/5096; C23C 16/515; H01J 37/32; H01J 37/32146; H01J 37/32357; H01J 37/32449; H01L 21/02532; H01L 21/0259; H01L 21/0262
See application file for complete search history.

(56) References Cited

U.S. PATENT DOCUMENTS

| | | | |
|---|---|---|---|
| 8,728,918 B2 | 5/2014 | Sheng et al. | |
| 2006/0005771 A1* | 1/2006 | White | C23C 16/4583 118/728 |

(Continued)

*Primary Examiner* — Brigitte Paterson
(74) *Attorney, Agent, or Firm* — Patterson + Sheridan, LLP

(57) ABSTRACT

The present disclosure generally relates to an improved method for forming low resistivity crystalline silicon films for display devices. The processing chamber in which the low resistivity crystalline silicon film is formed is pressurized to a predetermined pressure and a radio frequency power at a predetermined power level is delivered to the processing chamber. In addition, feeding locations of one or more VHF power generator and controlling of each VHF power generator via phase modulation and sweeping allows for plasma uniformity improvements by compensating for the non-uniformity of the thin film patterns produced by the chamber, due to the standing wave effect. Diffuser plate having two curved surfaces helps improve crystallinity uniformity.

12 Claims, 6 Drawing Sheets

(51) Int. Cl.
*C23C 16/509* (2006.01)
*H01J 37/32* (2006.01)

(52) U.S. Cl.
CPC ...... *H01L 21/0259* (2013.01); *H01L 21/0262* (2013.01); *H01L 21/02532* (2013.01)

(56) References Cited

U.S. PATENT DOCUMENTS

| | | |
|---|---|---|
| 2008/0173350 A1 | 7/2008 | Choi et al. |
| 2010/0059110 A1 | 3/2010 | Sheng et al. |
| 2010/0104772 A1 | 4/2010 | Kudela et al. |
| 2010/0258169 A1 | 10/2010 | Sheng et al. |
| 2011/0232753 A1* | 9/2011 | Sheng ............... H01L 31/03685 136/258 |
| 2011/0290183 A1 | 12/2011 | Choi et al. |
| 2013/0244446 A1* | 9/2013 | Tsuji ................. H01L 21/0228 438/778 |

* cited by examiner

METHODS AND APPARATUS FOR UNIFORMLY AND HIGH-RATE DEPOSITING LOW RESISTIVITY MICROCRYSTALLINE SILICON FILMS FOR DISPLAY DEVICES

CROSS-REFERENCE TO RELATED APPLICATIONS

This application claims priority to U.S. Provisional Patent Application Ser. No. 62/214,781, filed on Sep. 4, 2015, which herein is incorporated by reference.

BACKGROUND

Field

Embodiments of the present disclosure generally relate to a method and apparatus for forming low resistivity crystalline silicon films for display devices.

Description of the Related Art

Advanced and next generation displays require both active and passive devices capable of operating at high currents and/or high speeds for switching, direction or response, which put high demands for low resistivity silicon thin films, in addition to high mobility low temperature poly-Si (LTPSi) and metal oxide channel materials.

Doped amorphous silicon (a-Si), due to its high deposition rates and good large-area uniformity, has been widely used for the ohmic contact layer in doped a-Si thin film transistor (TFT) devices, for the n+/p+ junction layers and for the silicon/transparent conductive oxide (Si/TCO) ohmic contact layers in PIN or NIP photodiode sensors. However, the resistivity of n+ or p+ doped a-Si films could not be lowered enough because of low doping efficiency, to meet the requirements for high current or high speed display devices, such as LTPSi TFT, OLED, piezoresistive touch sensors, photodiode sensors. Crystalline silicon, such as microcrystalline or nanocrystalline silicon (mc-Si or nc-Si), is known to have much higher doping efficiency due to the crystalline phase, and hence much lower resistivity (or higher conductivity) that is at least 1-4 orders of magnitude lower than for a-Si counterparts. Highly conductive mc-Si layers are usually deposited at very low rates (<60-120 Å/min) from highly hydrogen-diluted plasma using various plasma enhanced chemical vapor deposition (PECVD) methods. Furthermore, it is challenging to grow mc-Si or nc-Si layers at high rates and uniformly regarding crystallinity and thickness over large-area substrates.

Therefore, there is a need in the art for an improved apparatus and method for forming low resistivity crystalline silicon films for display devices.

SUMMARY

The present disclosure generally relates to an improved apparatus and method for forming low resistivity crystalline silicon films for display devices. The processing chamber in which the low resistivity crystalline silicon film is formed is pressurized to a predetermined pressure and a radio frequency power at a predetermined power level is delivered to the processing chamber.

In one embodiment, a method includes placing a substrate into a processing chamber, supplying a gas mixture into the processing chamber, applying a RF power at a first mode to the gas mixture, pulsing the gas mixture into the processing chamber, and applying the RF power at a second mode to the pulsed gas mixture, wherein the RF power at the second mode has a power density ranging from about 1.5 Watts/cm$^2$ to about 3.5 Watts/cm$^2$.

In another embodiment, a method includes placing a substrate into a processing chamber, supplying a gas mixture into the processing chamber, wherein the gas mixture is flowing through a diffuser plate, wherein the diffuser plate comprises an outer region and an inner region, and wherein the inner region includes a first curved surface and a second curved surface opposite the first curved surface, applying a RF power at a first mode to the gas mixture, pulsing the gas mixture into the processing chamber, and applying the RF power at a second mode to the pulsed gas mixture, wherein the RF power at the second mode has a power density ranging from about 1.5 Watts/cm$^2$ to about 3.5 Watts/cm$^2$.

In another embodiment, a method includes placing a substrate into a processing chamber, supplying a gas mixture into the processing chamber, applying a RF power at a first mode to the gas mixture, wherein the RF power at the first mode has a power density ranging from about 0 Watts/cm$^2$ and about 1.5 Watts/cm$^2$, pulsing the gas mixture into the processing chamber, and applying the RF power at a second mode to the pulsed gas mixture, wherein the RF power at the second mode has a power density ranging from about 1.5 Watts/cm$^2$ to about 3.5 Watts/cm$^2$.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to an improved method for forming low resistivity crystalline silicon films for display devices. The processing chamber in which the low resistivity crystalline silicon film is formed is pressurized to a predetermined pressure and a radio frequency power at a predetermined power level is delivered to the processing chamber.

Figure 1:
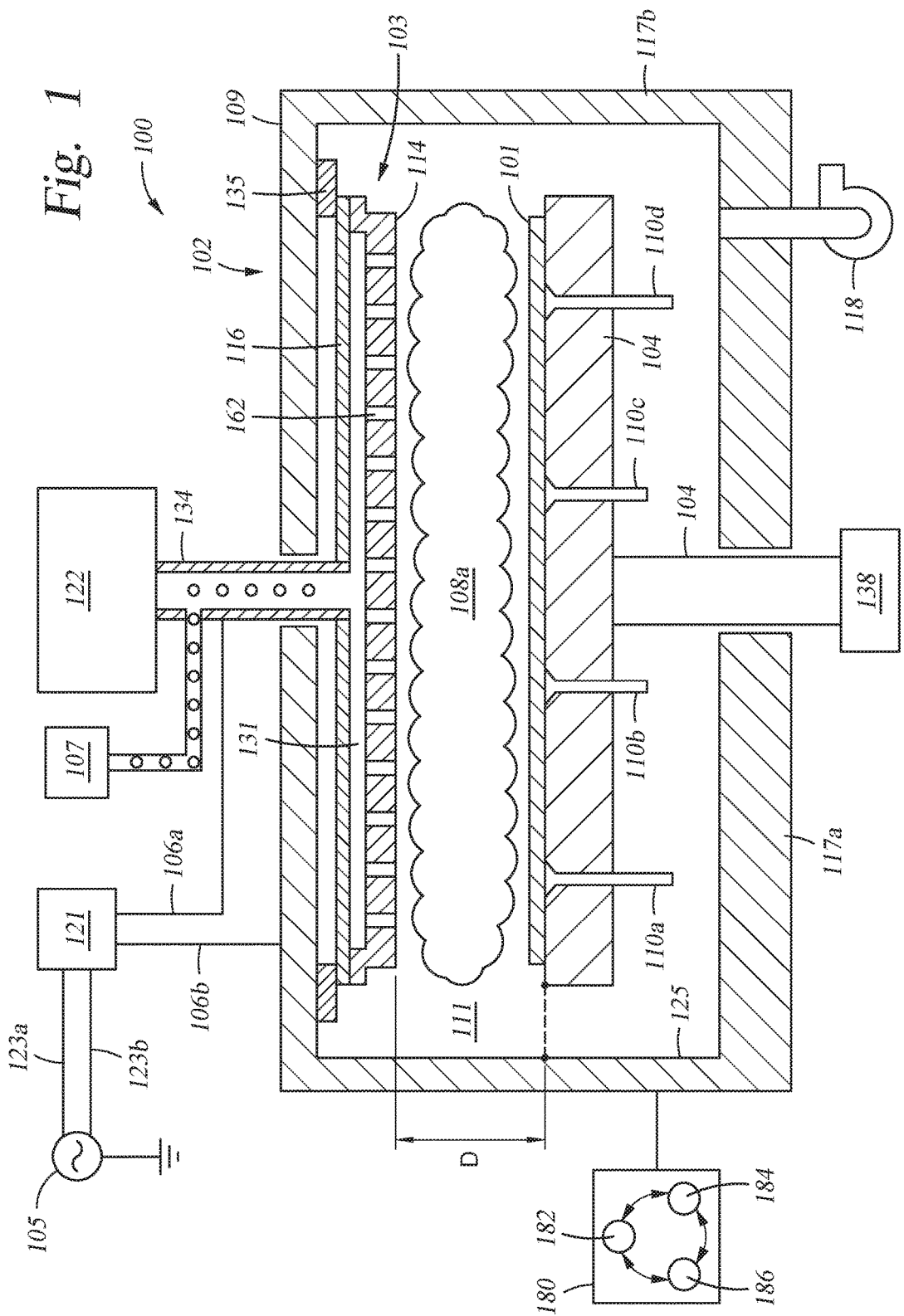
FIG. 1 is a schematic cross-sectional view of an illustrative plasma processing system having one embodiment of a gas distribution plate assembly, according to one embodiment disclosed herein.

FIG. 1 is a schematic cross-sectional view of one embodiment of a plasma processing system 100. The plasma processing system 100 is configured to process a large area substrate 101 using plasma in forming structures and devices on the large area substrate 101 for use in the fabrication of liquid crystal displays (LCDs), flat panel displays, organic light emitting diodes (OLEDs), or photovoltaic cells for solar cell arrays. The substrate 101 may be a thin sheet of metal, plastic, organic material, silicon, glass, quartz, or polymer, among other suitable materials. The structures may be thin film transistors which may comprise a plurality of sequential deposition and masking steps. Other structures may include p+aSi/n-cSi p-n heterojunctions to form diodes for photovoltaic cells. The plasma processing system 100 may be configured to deposit a variety of materials on the substrate 101, including, but not limited to, dielectric materials or crystalline silicon.

As shown in FIG. 1, the plasma processing system 100 generally comprises a chamber body 102 including a bottom 117a and sidewalls 117b that at least partially defines a processing volume 111. The sidewalls 117b support a lid assembly 109. The lid assembly 109 provides an upper boundary to the processing volume 111. A substrate support 104 is disposed in the processing volume 111. The substrate support 104 is adapted to support the substrate 101 on a top surface during processing. The substrate support 104 is coupled to an actuator 138 adapted to move the substrate support 104 at least vertically to facilitate transfer of the substrate 101 and/or adjust a distance D between the substrate support 104 and a diffuser plate 103. One or more lift pins 110a-110d may extend through the substrate support 104. The lift pins 110a-110d are adapted to contact the bottom 117a of the chamber body 102 and support the substrate 101 when the substrate support 104 is lowered by the actuator 138 in order to facilitate transfer of the substrate 101. In a processing position, as shown in FIG. 1, the lift pins 110a-110d are adapted to be flush with or slightly below the upper surface of the substrate support 104 to allow the substrate 101 to lie flat on the substrate support 104.

The diffuser plate 103 is configured to supply one or more processing gases to the processing volume 111 from one or more processing gas sources 122. The plasma processing system 100 also comprises an exhaust system 118 configured to apply negative pressure to the processing volume 111. The diffuser plate 103 is generally disposed opposing the substrate support 104 in a substantially parallel relationship.

In one embodiment, the diffuser plate 103 comprises a gas distribution plate 114 and a backing plate 116. The backing plate 116 may function as a blocker plate to enable formation of a gas volume 131 between the gas distribution plate 114 and the backing plate 116. The gas source 122 is connected to the gas distribution plate 114 by a conduit 134. In one embodiment, a plurality of gas passages 162 are formed through the diffuser plate 103 to allow a predetermined distribution of gas passing through the gas distribution plate 114 and into the processing volume 111. In one embodiment, a remote plasma source 107 is coupled to the conduit 134 for supplying a plasma of activated gas through the gas distribution plate 114 to the processing volume 111. The plasma from the remote plasma source 107 may include activated gases for cleaning chamber components disposed in the processing volume 111. In one embodiment, activated cleaning gases are flowed to the processing volume 111.

The gas distribution plate 114, the backing plate 116, and the conduit 134 are generally formed from electrically conductive materials and are in electrical communication with one another. The chamber body 102 is also formed from an electrically conductive material. The chamber body 102 is generally electrically insulated from the diffuser plate 103. In one embodiment, the diffuser plate 103 is mounted on the chamber body 102 by an insulator 135.

In one embodiment, the substrate support 104 is also electrically conductive, and the substrate support 104 and the diffuser plate 103 are configured to be opposing electrodes for generating a plasma 108a of processing gases therebetween during processing and/or a pre-treatment or post-treatment process.

A very high frequency (VHF) power generator 105 is generally used to generate the plasma 108a between the diffuser plate 103 and the substrate support 104 before, during and after processing, and may also be used to maintain energized species or further excite cleaning gases supplied from the remote plasma source 107. In one embodiment, the VHF power generator 105 is coupled to the diffuser plate 103 by a first line 106a of an impedance matching circuit 121. A second line 106b of the impedance matching circuit 121 is electrically connected to the chamber body 102.

During processing, one or more processing gas is flowed to the processing volume 111 from the gas source 122 through the diffuser plate 103. A RF power is applied between the diffuser plate 103 and the substrate support 104 to generate a plasma 108a from the processing gases for processing the substrate 101. Uniformity of plasma distribution is generally desired during processing, although tuning of the plasma uniformity may also be useful. However, the distribution of the plasma 108a is determined by a variety of factors, such as distribution of the processing gas, geometry of the processing volume 111, the distance D between the diffuser plate 103 and the substrate support 104, variations between deposition processes on the same substrate or different substrates, and deposition processes and cleaning process. The spacing between, or distance D, between the substrate support 104 and the showerhead assembly may be adjusted during pre-treatment, post-treatment, processing and cleaning in order to vary the ground return RF return paths.

In FIG. 1, the RF current path may be indicative of RF current flow during processing of the substrate 101. The RF current generally travels from a first lead 123a of the VHF power generator 105 to the first line 106a of the impedance matching circuit 121, then travels along an outer surface of the conduit 134 to a back surface of the backing plate 116, then to a front surface of the gas distribution plate 114. From the front surface of the gas distribution plate 114, the RF current goes through plasma 108a and reaches a top surface of the substrate 101 or the substrate support 104 to an inner surface 125 of the chamber body 102. From the inner surface 125, the RF current returns to a second lead 123b of the VHF power generator 105 from the impedance matching circuit 121.

The above-described chamber body 102 of the plasma processing system 100 can be controlled by a processor based system controller, such as controller 180. The controller 180 includes a programmable central processing unit (CPU) 182 that is operable with a memory 184 and a mass storage device, an input control unit, and a display unit (not shown), such as power supplies, clocks, cache, input/output (I/O) circuits, and the like, coupled to the various components of the chamber body 102 of the plasma processing system 100 to facilitate control of the substrate processing. The controller 180 also includes hardware for monitoring substrate processing through sensors (not shown) in the chamber body 102 of the plasma processing system 100.

To facilitate control of the chamber body 102 of the plasma processing system 100 described above, the CPU 182 may be one of any form of general purpose computer processor that can be used in an industrial setting, such as a programmable logic controller (PLC), for controlling various chambers and sub-processors. The memory 184 is coupled to the CPU 182 and the memory 184 is non-transitory and may be one or more of readily available memory such as random access memory (RAM), read only memory (ROM), floppy disk drive, hard disk, or any other form of digital storage, local or remote. Support circuits 186 are coupled to the CPU 182 for supporting the processor in a conventional manner. Charged species generation, heating, and other processes are generally stored in the memory 184, typically as a software routine. The software routine may also be stored and/or executed by a second CPU (not shown) that is remotely located from the hardware being controlled by the CPU 182.

The memory 184 is in the form of computer-readable storage media that contains instructions, that when executed by the CPU 182, facilitates the operation of the chamber body 102 of the plasma processing system 100. The instructions in the memory 184 are in the form of a program product such as a program that implements the method of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

Figure 2A:
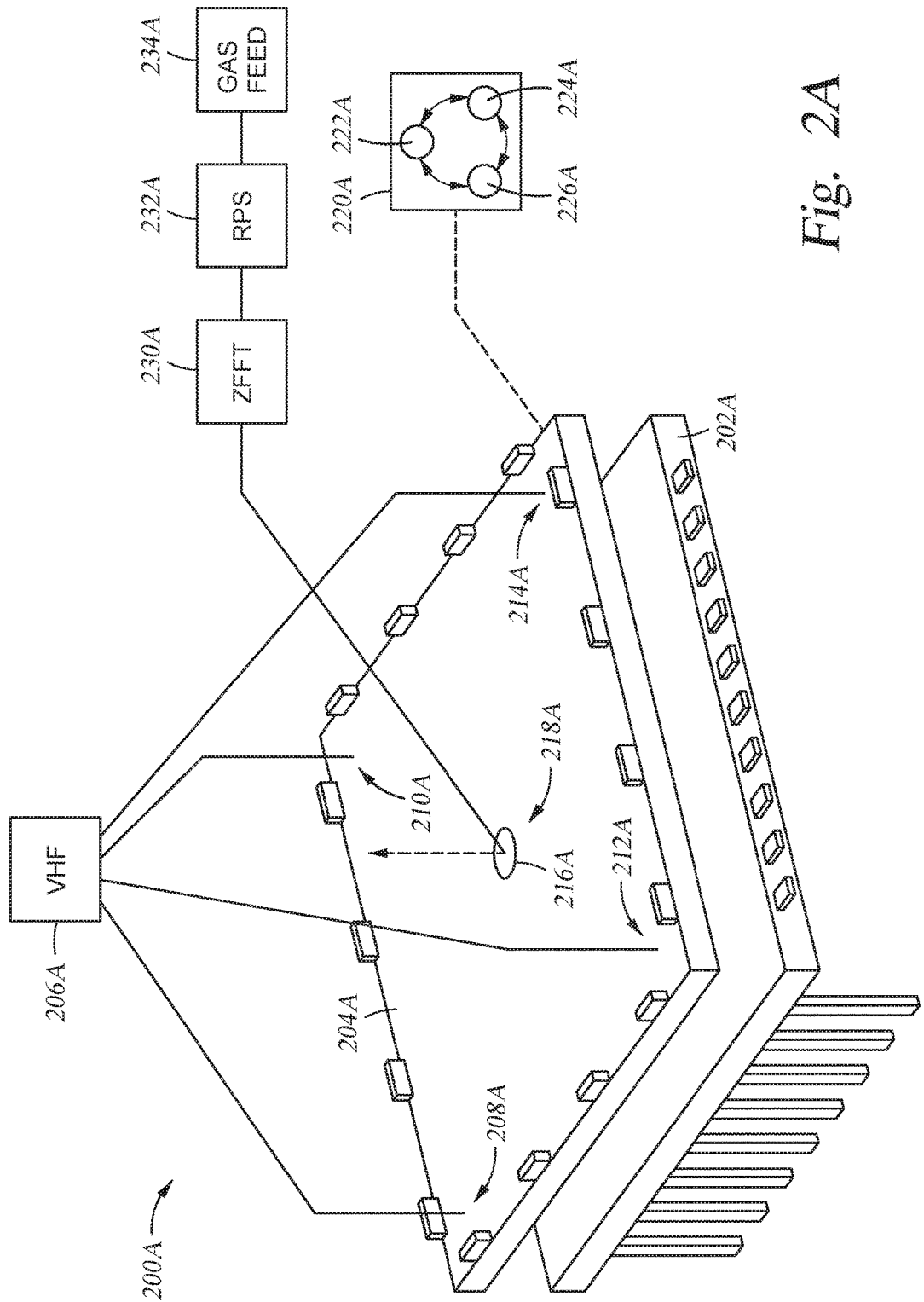
FIG. 2A is a schematic perspective view of a plasma processing chamber having one VHF power generator disposed therein, according to one embodiment disclosed herein.

FIG. 2 is a schematic perspective view of a plasma processing chamber 200A for a plasma enhanced chemical vapor deposition system, according to one embodiment. The plasma processing chamber 200A includes a substrate support 202A. The substrate support 202A may be utilized in the plasma enhanced chemical vapor deposition system 100, as shown in FIG. 1, such as within and/or coupled to the chamber body 102 of the plasma processing system 100, in lieu of substrate support 104. It is contemplated, however, that the disclosed substrate support 202A may be utilized in and/or with any suitable plasma processing chamber. As shown, the chamber 200A includes a lid 204A disposed opposite the substrate support 202A. The lid 204A may be the lid 109 shown in FIG. 1. The lid 204A may include a powered diffuser, a backing plate, and a cover plate that can assist with the modifying of the uniformity pattern of a thin film deposited in the plasma processing chamber which includes as least one RF power source. In some embodiments, the RF power source may be a VHF power generator, such as the VHF power generator 206A shown in FIG. 2. The lid 204A assists with the modifying of the uniformity pattern of a thin film deposited in a plasma processing chamber which includes at least one VHF power generator 206A coupled to the lid 204A within the plasma processing chamber.

As shown in FIG. 2, the lid 204A has a first corner location 208A, a second corner location 210A, a third corner location 212A, and a fourth corner location 214A. The lid 204A also has an opening 216A at a substantial center 218A of the lid 204A. In some embodiments, gas may be fed from a gas feed 234A through the opening 216A. As such, the opening 216A is configured to hold and/or support a gas feed device.

The VHF power generator 206A is coupled to the lid 204A at one or more locations. In some embodiments, the VHF power generator 206A may be coupled to the lid 204A at multiple locations. As shown, the VHF power generator 206A is coupled to the lid 204A at the first corner location 208A, the second corner location 210A, the third corner location 212A, and the fourth corner location 214A. In some embodiments, each connection location of the VHF power generator 206A to the lid 204A may be disposed equidistant from the center 218A of the lid 204A.

In some embodiments, the plasma processing chamber 200A may be operatively connected to a zero field feed through (ZFFT) 230A. The ZFFT 230A may minimize parasitic plasma. Furthermore, the ZFFT 230A may be operatively connected to a remote plasma source (RPS) 232A. The RPS 232A may be operatively connected to the gas feed 234A.

A controller 220A is programmed to control operation of the VHF power generator 206A. The controller 220A may be the same as the controller 180 shown in FIG. 1. The controller 220A includes a CPU 222A, a memory 224A, and support circuits 226A. The CPU 222A may be the same as the CPU 182, the memory 224A may be the same as the memory 184, and the support circuits 226A may be the same as the support circuits 186. In some embodiments, the controller 220A is programmed to control operation of the VHF power generator 206A at the first corner location 208A, the second corner location 210A, the third corner location 212A, and/or the fourth corner location 214A. In some embodiments, the controller 220A is programmed to control operation of the VHF power generator 206A at the first corner location 208A, the second corner location 210A, the third corner location 212A, and/or the fourth corner location 214A at a first frequency via an automatic match. In some embodiments, the first frequency may be between about 20 MHz and about 100 MHz, for example, between about 30 MHz and about 70 MHz. Furthermore, the controller 220A is programmed to perform phase modulation and sweeping. In some embodiments, a distinct match is located at each corner location 208A, 210A, 212A, and 214A, and the VHF power is fed into the fixed matches from the VHF power generator 206A. In one embodiment, VHF power is fed into the fixed matches at corner locations 208A and 214A at 40.68 MHz and 180 degrees apart at match output, and VHF power is fed into the fixed matches at corner locations 210A and 212A at 40.69 MHz and 180 degrees apart. Small differences in frequencies and randomized phase relationship between any feed or two pairs of fees are utilized to generate desired effect for improved uniformity. In some embodiments, VHF power is fed into the fixed matches at corner locations 208A and 214A at 40 MHz in-phase, and VHF power is fed into the fixed matches at corner locations 210A and 212A at 40 MHz and 180 degrees out-of-phase. In some embodiments, multiple VHF power generators are utilized so a distinct VHF power generator is providing VHF power to each of the corner locations 208A, 210A, 212A and 214A.

Figure 2B:
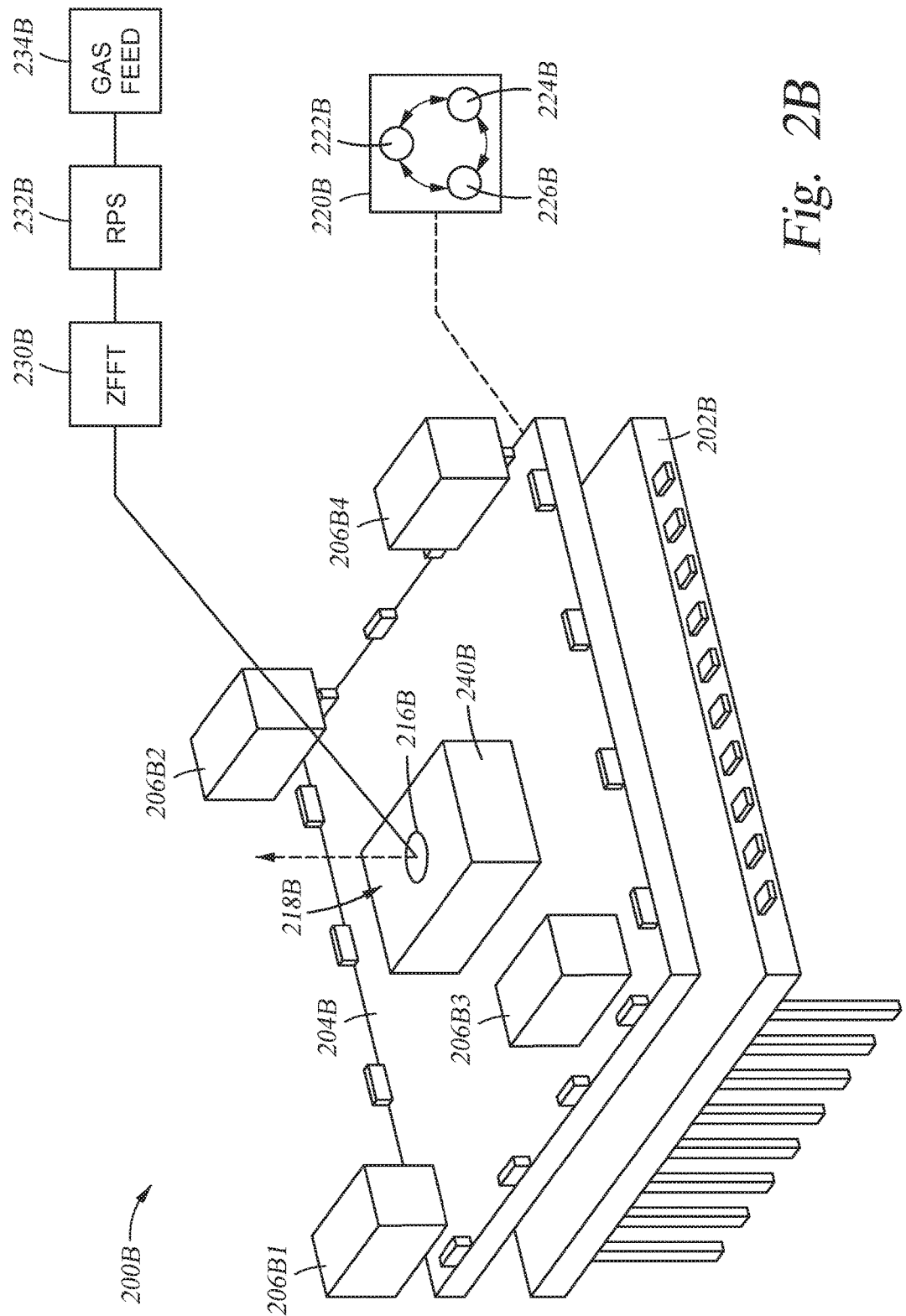
FIG. 2B is a schematic perspective view of a plasma processing chamber having more than one VHF power generator disposed therein, according to one embodiment disclosed herein.

FIG. 2B is a schematic perspective view of a plasma processing chamber 200B for a plasma enhanced chemical vapor deposition system, according to one embodiment. The plasma processing chamber 200B includes a substrate support 202B. The plasma processing chamber 200B is substantially similar to the plasma processing chamber 200A, and the substrate support 202B is substantially similar to the substrate support 202A. The substrate support 202B may be utilized in the plasma enhanced chemical vapor deposition system 100, as shown in FIG. 1, such as within and/or coupled to the chamber body 102 of the plasma processing system 100, in lieu of substrate support 104. It is contemplated, however, that the disclosed substrate support 202B may be utilized in and/or with any suitable plasma processing chamber. As shown, the chamber 200B includes a lid 204B disposed opposite the substrate support 202B. The lid 204B may be the lid 109 shown in FIG. 1. The lid 204B may include a powered diffuser, a backing plate, and a cover plate that can assist with the modifying of the uniformity pattern of a thin film deposited in the plasma processing chamber which includes at least one RF power source. In some embodiments, the RF power source(s) may be multiple VHF power generator, such as the VHF power generators 206B1, 206B2, 206B3, and 206B4 discussed infra.

The plasma processing chamber 200B further includes a first VHF power generator 206B1, a second VHF power generator 206B2, a third VHF power generator 206B3, and a fourth VHF power generator 206B4. The first VHF power generator 206B1 is coupled to the lid 204B at a first radius from the center 218B of the lid 204B and at a first azimuth angle. The second VHF power generator 206B2 is coupled to the lid 204B at a second radius from the center 218B of the lid 204B and at a second azimuth angle. The third VHF power generator 206B3 is coupled to the lid 204B at a third radius from the center 2186 of the lid 204B and at a third azimuth angle. The fourth VHF power generator 206B4 is coupled to the lid 204B at a fourth radius from the center 2186 of the lid 204B and at a fourth azimuth angle.

Each of the second VHF power generator 206B2 and the fourth VHF power generator 206B4 are configured to generate power at a frequency between about 20 MHz and about 100 MHz, for example, between about 30 MHz and about 70 MHz. Furthermore, the second VHF power generator 206B2 is configured to provide power out of phase with that provided by the fourth VHF power generator 206B4, for example 180 degrees apart at the match output. By way of example only, in some embodiments, the first VHF power generator 206B1 and the third VHF power generator 206B3 may each have VHF fed therein at fixed matches at 60 MHz and 180 degrees apart at match output. Furthermore, the second VHF power generator 206B2 and the fourth VHF power generator 206B4 may each have VHF fed therein at fixed matches at 60.1 MHz and 180 degrees apart at match output. As such, a phase of 60 MHz shifts at 0.1 MHz, relative to 60.1 MHz, thus creating a phase sweeping.

Moreover, each of the first VHF power generator 206B1 and the third VHF power generator 206B3 are configured to generate power at the same, or similar, RF frequency, such as between about 20 MHz and about 100 MHz, for example, between about 30 MHz and about 70 MHz. However, the first VHF power generator 206B1 and the third VHF power generator 206B3 are each configured to generate power at a frequency that is different than a frequency of power generated by either of the second VHF power generator 206B2 and/or the fourth VHF power generator 206B4. Likewise, in certain embodiments, the second VHF power generator 206B2 and the fourth VHF power generator 206B4 are each configured to generate power at a frequency that is different than a frequency of power generated by either of the first VHF power generator 206B1 and/or the third VHF power generator 206B3. Furthermore, the first VHF power generator 206B1 is configured to provide power out of phase with that provided by the third VHF power generator 206B3, for example, 180 degrees apart.

As shown in FIG. 2B, the lid 204B has an opening 216B at a substantial center 218B of the lid 204B. In some embodiments, a gas feed 234B may be disposed through the opening 216B. As such, the opening 216B is configured to hold and/or support the gas feed 234B.

In some embodiments, the plasma processing chamber 200B may be operatively connected to a zero field feed through (ZFFT) 230B. The ZFFT 230B may minimize parasitic plasma. Furthermore, the ZFFT 230B may be operatively connected to a remote plasma source (RPS) 232B. The RPS 232B may be operatively connected to the gas feed 234B.

An RF match network 240B may be operatively connected to the lid 204B. The RF match network 240B may be disposed at or near the center 218B of the lid 204B.

As shown in FIG. 2B, a controller 220B is operatively connected to the plasma processing chamber 200B. Controller 220B is substantially similar to controller 220A. Furthermore, controller 220B contains the same components as those of controller 220A, including a CPU 222B, memory 224B, and support circuits 226B, each of which is substantially similar to the CPU 222A, the memory 224A, and the support circuits 226A described respectively above. The controller 220B is programmed to control operation of each of the first VHF power generator 206B1, the second VHF power generator 206B2, the third VHF power generator 206B3, and/or the fourth VHF power generator 206B4. In some embodiments, the controller 220B is programmed to control operation of each of the first VHF power generator 206B1, the second VHF power generator 206B2, the third VHF power generator 206B3, and/or the fourth VHF power generator 206B4 at a first frequency via an automatic match. In some embodiments, the first frequency may be between about 20 MHz and about 100 MHz, for example, between about 30 MHz and about 70 MHz. Furthermore, the controller 220B is programmed to perform phase modulation and sweeping. Phase modulation and sweeping can quickly to sustain the plasma in the processing volume (<~200 μs/period for phase scheme). Lightly different frequencies and randomized phase relationship between any feed or two sets of feeds can generate a desired effect, such as improved uniformity. In addition, phase modulation and sweeping can smoothly minimize fluctuations in the reflected power (sinusoidal).

Figure 3:
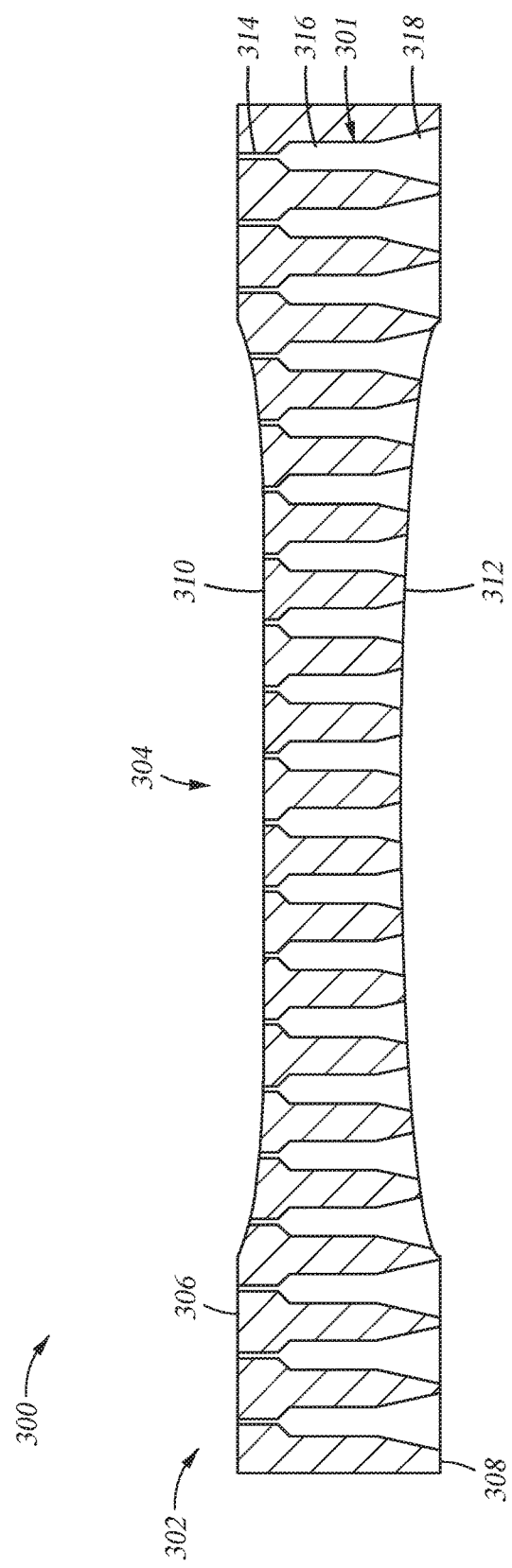
FIG. 3 is a schematic cross-sectional view of a diffuser plate, according to one embodiment disclosed herein.

FIG. 3 is a schematic cross-sectional view of a diffuser plate 300, according to one embodiment. Diffuser plate 300 may be utilized in lieu of diffuser plate 103 shown in FIG. 2 or FIG. 1. Diffuser plate 300 may be utilized in the chamber body 102 of the plasma processing system 100, described supra. Diffuser plate 300 includes an outer region 302, an inner region 304, and a plurality of through holes 301. The outer region 302 includes a first surface 306 and a second surface 308 opposite the first surface 306. The first surface 306 may be facing the backing plate 116 shown in FIG. 1, and the second surface 308 may be facing the substrate support 104 shown in FIG. 1. The first surface 306 and the second surface 308 of the outer region 302 may be substantially parallel. The inner region 304 includes a first surface 310 and a second surface 312 opposite the first surface 310. The first surface 310 may be facing the backing plate 116 shown in FIG. 1, and the second surface 312 may be facing the substrate support 104 shown in FIG. 1. The first surface 310 and the second surface 312 may be curved, as shown in FIG. 3. In one embodiment, the first surface 310 has a concave curve and the second surface 312 has a concave curve, as shown in FIG. 3.

Each through hole 301 includes a first region 314, a second region 316, and a third region 318. The first region 314 may be extended to the first surface 306 or 310, and the first region 314 may have a constant cross sectional area. The third region 318 may be extended to the second surface 308 or 312, and the third region 318 may have a conic shape with the larger cross sectional area at the second surface 308 or 312. The smallest cross sectional area of the third region 318 is larger than the constant cross sectional area of the first region 314. The second region 316 may be connecting the first region 314 and the third region 318. By having the curved first surface 310 and second surface 312 in the inner region 304, crystal formation at four corners of a crystalline silicon layer on a substrate, such as the substrate 101 shown in FIG. 1, during the deposition of the crystalline silicon layer on the substrate is increased to improve the uniformity of film crystallinity over the entire substrate.

Figure 4:
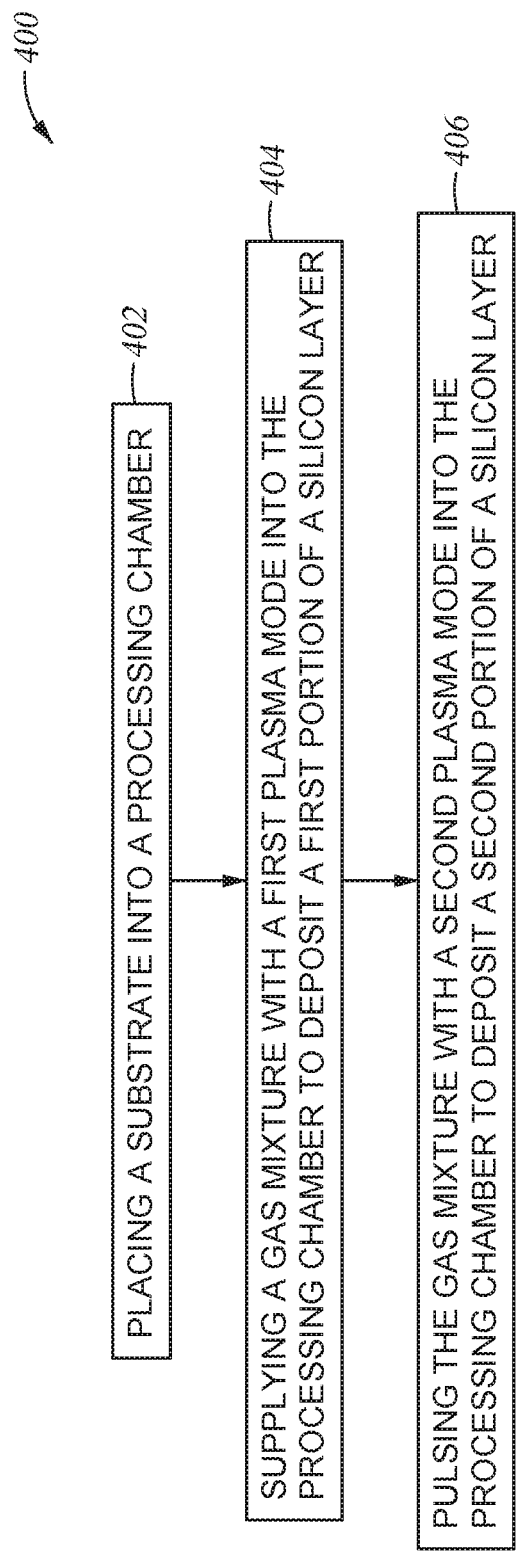
FIG. 4 is a process flow describing a method to deposit a crystalline silicon layer according to one embodiment disclosed herein.

FIG. 4 depicts a process flow of a method 400 for depositing a crystalline silicon layer, such as a microcrystalline silicon layer or a nanocrystalline silicon layer. The method 400 may be performed in a plasma chamber, such as the plasma processing system 100 depicted in FIG. 1. It is noted that the method 400 may be performed in any suitable plasma processing chamber, including those from other manufacturers.

The method 400 begins at block 402 by placing a substrate, such as the substrate 101 depicted in FIG. 1, into a processing chamber. The processing chamber may be the plasma processing system 100 depicted in FIG. 1.

At block 404, a gas mixture is supplied into the processing chamber to deposit a first portion of a crystalline silicon layer. During depositing, the RF power applied to ignite the plasma in the gas mixture may be controlled at a first mode to facilitate depositing the layer with predetermined film properties. In one embodiment, the gas mixture may include a silicon-based gas and a hydrogen based gas. Suitable silicon based gases include, but are not limited to, silane ($SiH_4$), disilane ($Si_2H_6$), silicon tetrafluoride ($SiF_4$), silicon tetrachloride ($SiCl_4$), dichlorosilane ($SiH_2Cl_2$), and combinations thereof. Suitable hydrogen-based gases include, but are not limited to, hydrogen gas ($H_2$). In one embodiment, the silicon based gas described herein is silane ($SiH_4$) and the hydrogen-based gas described herein is hydrogen ($H_2$).

In one embodiment, the silicon based gases, such as the silane gas, supplied in the gas mixture may be gradually ramped up from a first predetermined set point to a second predetermined set point during a first process period. For example, as an exemplary embodiment depicted in FIG. 5, the silane gas flow, as depicted by trace line 502, in the gas mixture may be gradually ramped up from a first predetermined set point $F_1$ to a predetermined set point $F_2$ at a predetermined time period $T_2$ at a first process period 506 performed at block 404. It is noted that the term "ramp up" used herein means gradually tuning up a process parameter from a first set point to a second set point at a predetermined time period with a desired ramp-up rate. The term "ramp up" used herein is not a sudden change caused by an action of throttle valve open or close.

In one embodiment, the first and the second predetermined set points $F_1$, $F_2$ of the silane gas flow may be varied according to different requirements for the film quality. It is believed that the gradually ramp-up of the silane gas flow in the gas mixture may assist silicon atoms to uniformly adhere and distribute on the substrate surface. Uniform adherence of the silicon atoms on the substrate surface provides good nucleation sites for the subsequent atoms to nucleate thereon. Uniform nucleation sites formed on the substrate promotes crystallinity of the films subsequently formed thereon. Therefore, the gradually ramp-up of the silane flow in the gas mixture allows the dissociated silicon atoms from the gas mixture to have sufficient time to be gradually absorbed on the substrate surface, thereby providing a surface having an even distribution of silicon atoms that provides nucleation sites which promote improved crystallinity of the subsequent deposited layers.

In one embodiment, the silane gas flow supplied at block 404 during the first process period 506 is supplied from the first set point $F_1$, such as zero, to the second set point $F_2$, such as between about 2.8 sccm/L and about 5.6 sccm/L, for example about 3.99 sccm/L (about 570 sccm). The predetermined time period $T_2$ for silane flow to ramp up is between about 20 seconds to about 300 seconds, such as between about 40 seconds and about 240 seconds, such as between about 60 seconds and about 120 seconds. Although the embodiment depicted in FIG. 5 indicates that the silane gas flow trace line 502 gradually ramps up linearly, it is noted that the silane gas flow may be supplied using other ramping profiles, such as parabolic, reverse-parabolic, or curved, or any other suitable profile, until a predetermined gas flow rate of silane flow is reached.

Figure 5:
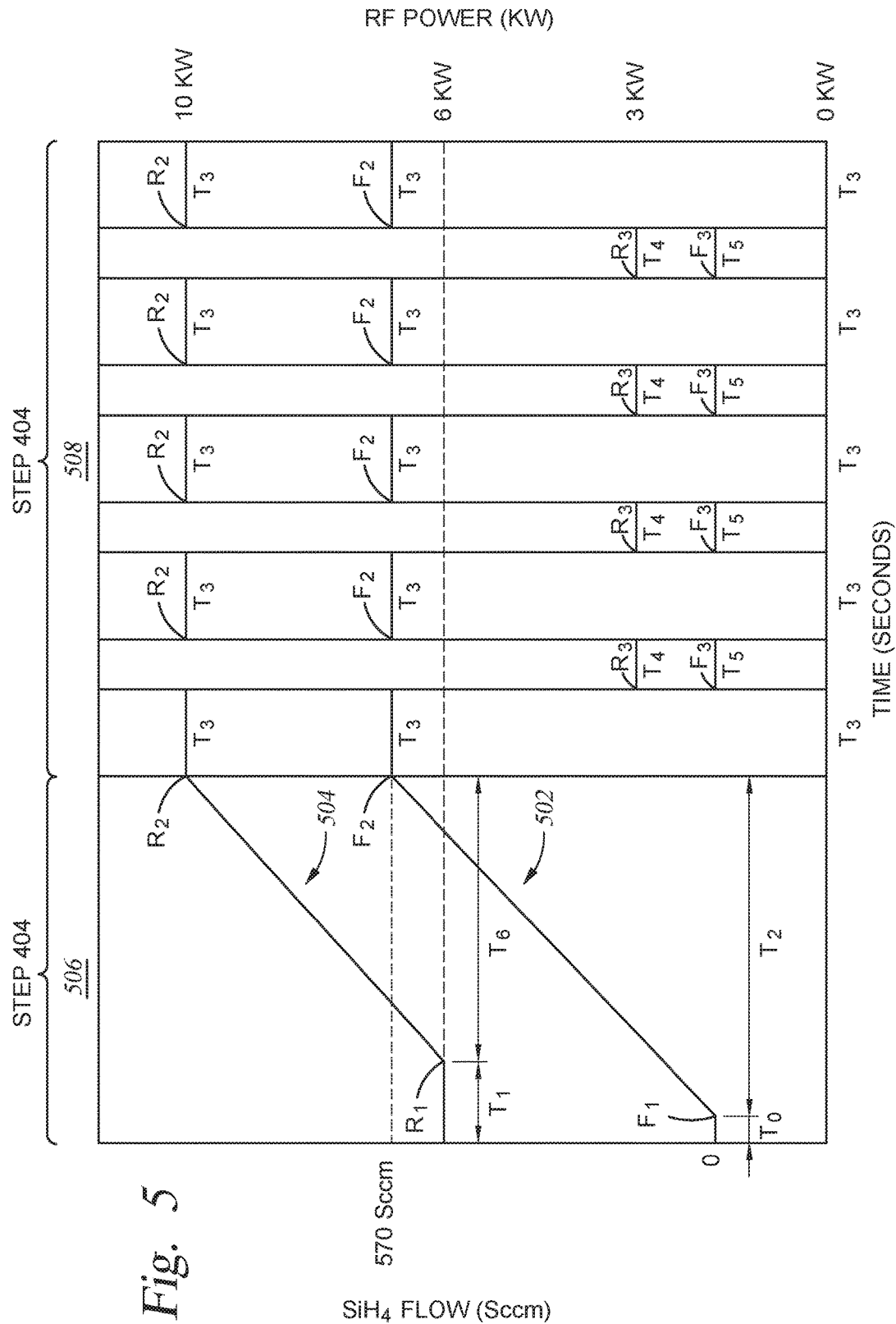
FIG. 5 is a chart describing a gas flow rate and radio frequency (RF) power supplied during deposition of a crystalline silicon layer according to one embodiment disclosed herein.

In one embodiment, the silane gas and the hydrogen gas may be supplied into the processing chamber at a predetermined gas flow ratio. The predetermined gas flow ratio of hydrogen to silane gas assists the crystalline silicon layer to be formed with a desired crystalline fraction and grain structure. In one embodiment, the hydrogen to silane gas flow ratio (e.g., flow volume ratio) in the gas mixture is controlled between about 20:1 and about 200:1, or between about 30:1 and about 150:1, such as about 50:1. In one particular embodiment, the hydrogen gas supplied in the gas mixture may be provided at a steady rate while the silane gas flow is gradually ramped up until a desired ratio of the silane gas to the hydrogen gas is reached. For example, if the target second silane flow $F_2$ is set about 3.99 sccm/L, as depicted in FIG. 5, and the ratio of the hydrogen to silane gas flow is set at 50:1, the hydrogen gas may be supplied at about 199.5 sccm/L (e.g., 3.99 sccm/L×50=199.5 sccm/L) at the beginning of the first process period $T_0$ to the end of the first process time period 506. In contrast, the silane gas flow is gradually supplied and ramped up from zero $F_1$ to the target silane flow $F_2$ of 3.99 sccm/L at the predetermined time period $T_2$. It is believed that the low silane flow rate in the initial stage of the deposition may assist formation of film crystalline and nucleation sites due to the relatively pure hydrogen plasma environment and/or high hydrogen dilution in the gas mixture.

During depositing at block 404, the RF power applied to ignite the plasma in gas mixture may be controlled to improve crystallinity of the deposited film and to increase deposition rate. For example, as the silane flow supplied in the gas mixture is gradually ramped up, the RF power applied to the processing chamber is also configured to be gradually ramped up to prevent overly exciting or dissociating the gas species supplied in the gas mixture at the initial stage of the process. Providing an overly high amount of RF power at the initial stage of the deposition may result in high ion bombardment, which may damage the underlying layers, produce arcing on the substrate surface and the chamber hardware components, and contribute to a non-uniform or overly excited state of the ions formed in the gas mixture, which may result in non-uniform distribution of the atoms on the substrate surface. In order to prevent such occurrences, the RF power is gradually ramped up to prevent ions from being dissociated in an overly excited or unstable state.

In one embodiment, as depicted in FIG. 5, in the early stage of the block 404, the RF power, as shown by the RF trace line 504, is applied at a first lower set point $R_1$ during a first time period $T_1$. After the gas mixture, such as the silane gas shown in trace line 502, is supplied to the processing chamber, the RF power then gradually ramped up from the first lower set point $R_1$ to a second higher set point $R_2$ at the second time period $T_6$. In other words, the RF power ramps up to the second set point $R_2$ has a time delay $T_1$ as compared to the time point $T_0$ when the gas mixture is supplied into the processing chamber. The time period of $T_1$ is controlled to be longer than the time period of $T_0$ so that ramping of the RF power lags behind supply of the gas mixture into the processing chamber. In one embodiment, the $T_1$ period may be controlled between about 0.1 seconds and about 240 seconds, such as between about 5 seconds and about 80 seconds, for example about 30 seconds. After the predetermined time period $T_1$ is lapsed, the RF power may then be applied to ignite the plasma in the gas mixture.

Similar to the manner used to control the silane flow at block 404, the RF power applied to the processing chamber may be ramped up from the first set point $R_1$ to the second set point $R_2$ during the predetermined time period $T_6$, as depicted in FIG. 5. In one embodiment, the first lower set point $R_1$ of the RF power is controlled between about 0 Watts and about 10 KiloWatts, such as between 0 KiloWatts and about 6.6 KiloWatts, for example 6 KiloWatts. If the power unit is represented by power density, the RF power density may be controlled at between about 0 Watts/cm$^2$ and about 2.4 Watts/cm$^2$, such as between about 0 Watts/cm$^2$ and about 1.5 Watts/cm$^2$. The second higher set point $R_2$ of the RF power is controlled between about 2 KiloWatts and about 15 KiloWatts, such as between about 6.6 KiloWatts and about 15 KiloWatts, for example about 10 KiloWatts. If the power unit is represented by power density, the RF power density may be controlled between about 0.46 Watts/cm$^2$ and about 3.5 Watts/cm$^2$, such as between about 1.5 Watts/cm$^2$ and about 3.5 Watts/cm$^2$, for example between about 2.3 Watts/cm$^2$ and about 3.5 Watts/cm$^2$. Similar to the manner utilized to control silane flow 502, the RF power as applied to the processing chamber may by gradually ramped up in a linear, parabolic, reverse-parabolic, or curved, or any other suitable profiles, until the second set point $R_2$ of RF power is reached, as discussed above.

In one embodiment, the total process time 506 of the block 404 is controlled to deposit the crystalline silicon layer to a predetermined thickness range. Furthermore, the total process time 506 for RF power and the silane gas flow to be ramped up to the desired target value $R_2$, $F_2$ is controlled at a similar time frame. For example, the total time length of the RF ramp-up time ($T_1+T_6$) is controlled to be similar to the total time length of the silane ramp-up time ($T_0+T_2$). During the predetermined first time period 506, the total time period for RF ramp-up time ($T_1+T_6$) and silane ramp-up time ($T_0+T_2$) is controlled to be between about 5 seconds and about 300 seconds. In other words, toward the end of the first time period 506, the RF power and the silane flow in the gas mixture will be applied and supplied in the processing chamber close to the desired second set points, $R_2$ and $F_2$, so that the RF power and the silane flow can be maintained in a steady state while entering into the next process step and process time period.

During block 404, several process parameters may be controlled during deposition process. The process pressure may be controlled between about 10 Torr and about 15 Torr. The substrate temperature may be controlled between about 50 degrees Celsius and about 300 degrees Celsius, such as between about 100 degrees Celsius and about 250 degrees Celsius, for example about 200 degrees Celsius.

At block 406, after the RF power 504 and the silane flow 502 supplied to the processing chamber have reached the predetermined set points $R_2$, $F_2$, the manner in which the gas mixture and the RF power supplied and applied into the processing chamber is varied using a second mode to deposit a second portion of the crystalline silicon layer. Hydrogen gas may be flowed into the processing chamber at a rate of about 199.5 sccm/L during operations at block 406. Instead of continuously supplying RF power and gas mixture into the processing chamber, the RF power and the gas mixture in the second process time period 508 at block 406 are pulsed. In the exemplary embodiment depicted in FIG. 5, as the set points $R_2$, $F_2$ are reached after the first process period 506, the supply of RF power 504 and the silane gas flow 502 is alternated to pulse the RF power and silane gas flow into the processing chamber over different time periods defined in the second process period 508. The length of the second process period 508 may be controlled to deposit a predetermined thickness of the crystalline silicon layer is reached. For example, the total second process period 508 may be controlled between about 300 seconds to about 3600 seconds, such as about 600 seconds and about 1800 seconds.

In one embodiment, when entering into the second process time period 508, the RF power and the gas flow rate may be maintained at about the same level as the set points $R_2$, $F_2$ at block 404. After the silane flow 502 is supplied at the flow rate $F_2$ for a predetermined time period $T_3$, the silane flow 502 may be pulsed and turned down to a third flow rate $F_3$ for another predetermined time period $T_5$. In one embodiment, the flow rate $F_3$ is controlled at between about 0 sccm/L and about 1.42 sccm/L. In the embodiment wherein flow rate $F_3$ is controlled at zero, the silane gas flow 502 is substantially turned off. Subsequently, the silane flow 502 may be maintained in an "on-off" pulsed mode until the predetermined process time period 508 is reached.

Similar to the arrangement for supplying the silane flow, after the process has entered into the second process time period 508, the RF power applied to ignite the plasma may be set to a pulsed mode, intermittently applying RF power over different time spans during the second process time period 508. As depicted in FIG. 5, after the RF power 504 is applied at the set point $R_2$ for a predetermined time period $T_3$, the RF power 504 may be pulsed and applied at a different power range $R_3$ for another predetermined time period $T_4$. Subsequently, the RF power 504 may maintain in the pulsed mode and intermittently applied into the processing chamber until the predetermined process time period 508 is expired. In one embodiment, the RF power 504 may be supplied from a first power for the first time period $T_3$ and pulsed/lowered to a second power for the second time period $T_4$. In one embodiment, the RF power 504 may be supplied from the first range $R_2$ between about 10 KiloWatts and about 15 KiloWatts, for example about 10 KiloWatts, and lowered down the second range R₃ to between about 0 KiloWatts and about 3 KiloWatts, for example about 3 KiloWatts.

In one embodiment, the RF power range and the gas flow rate may be pulsed synchronously lagged, or alternatively to maintain a desired processing condition of the processing chamber. It is believed that utilizing pulse mode for applying RF power to produce plasma in the gas mixture may reduce likelihood of arcing during processing. Pulse RF power mode may also prevent overheat of the substrate during processing, which may adversely result in low film quality and electrical properties. Additionally, pulse RF power mode may give the option for higher voltage and peak power during processing while keeping an average power at a lower range, thereby efficiently improving the deposition rate without causing overly high ion bombardment to the substrate surface.

Higher deposition rates are desired to achieve high throughput and low production costs. To grow mc-Si or nc-Si particularly thin layers, one has to carefully control the initial stage of crystal growth to minimize or eliminate the amorphous incubation layer. To significantly improve the mc-Si or nc-Si deposition rate (DR) while retaining high crystallinity and/or low resistivity, the high-pressure (10 to 15 Torr) plasma process with high RF power as shown at blocks 404 and 406 shown in FIG. 4, which enabled DR of greater than 1000 Å per minute, such as about 1500 Å per minute, without plasma overheating issues (e.g., temperature control, process drifting, etc). By using the above method 400 shown in FIG. 4, very low resistivity HDR mc-Si or nc-Si thin layers were deposited, both n-type and p-type. The crystallinity (resistivity) and DR were found to be dependent on pressure, RF power, SiH₄/H₂ gas flow rates and ratio, temperature, as well as doping concentration.

To further improve the crystal uniformity over the large-size substrates, the diffuser plate 300 as shown in FIG. 3 was utilized, as the diffuser plate 300 could compensate for RF voltage or plasma potential non-uniformity. The diffuser back side scooping (i.e., the first curved surface 310 shown in FIG. 3) was to change the flow conductance (higher crystallinity at lower conductance, or vice versa), and the front side scooping (i.e., the second curved surface 312 shown in FIG. 3) to change the spacing to compensate for DR (higher DR at smaller spacing, or vice versa), which could balance and optimize the crystallinity and thickness uniformities for mc-Si or nc-Si layers.

The low-resistivity mc-Si, nc-Si or pc-Si layers could be used for, but not limited to the following display sensor or TFT device applications: (1) Force (pressure, or strain) touch sensors: the p+ or n+ piezoresistive gauges having high-crystallinity and optimized doping levels for high gauge factor (or sensitivity); and the low-resistivity p++ or n++ for ohmic contacts with electrode metals. The low-resistivity mc-Si or nc-Si doped layers could provide superior temperature coefficient of resistance to mono or poly Si materials, and also higher sensitivity and better reliability than amorphous doped Si materials; (2) PIN or NIP photodiode as ambient light sensors: the n+/p+ junction layers and the Si/TCO ohmic contact and window layers, due to lower resistivity and higher transparency than amorphous doped Si materials; (3) LTPS TFT devices: the n+ or p+ dopant sources for the Source/Drain areas without the need for ion implantation doping; (4) a-Si TFT devices: the n+ ohmic layers with Source/Drain metals.

The crystallinity and thickness uniformity can be further improved by utilizing VHF multi-feeds as shown in FIG. 2. The VHF power arrangement shown in FIG. 2 is also referred to as VHF rotating push-pull which could provide additional power (plasma density) deposited around the chamber perimeter and at the edges and corners of the diffuser, which were utilized for higher pressure plasma depositions of mc-Si films on large-area substrates. As demonstrated by using additional VHF multi-feeds rotating push-pull and the modified diffuser scooping profiles, HDR mc-Si layers could be grown over the entire large substrates with improved crystallinity and thickness uniformity.

While the foregoing is directed to embodiments of the present disclosure, other and further embodiments of the disclosure may be devised without departing from the basic scope thereof, and the scope thereof is determined by the claims that follow.

What is claimed is:

1. A method for forming a crystalline silicon layer, comprising:
    placing a substrate into a processing chamber;
    supplying a gas mixture into the processing chamber;
    applying a RF power at a first mode to the gas mixture;
    pulsing the gas mixture into the processing chamber; and
    applying the RF power at a second mode to the pulsed gas mixture, wherein the RF power at the second mode has a power density ranging from 1.5 Watts/cm² to 3.5 Watts/cm², wherein supplying the gas mixture further comprises ramping up a flow rate of the gas mixture supplied into the processing chamber, wherein the flow rate of the gas mixture is ramped up to a predetermined set point over a period of between 5 seconds and 300 seconds, and wherein the flow rate of the gas mixture is ramped up from zero sccm/L to between 2.8 sccm/L and 5.6 sccm/L.

2. The method of claim 1, wherein applying the RF power at the first mode further comprises:
    depositing a first portion of the crystalline silicon layer on the substrate in the presence of the gas mixture and the first RF power mode.

3. The method of claim 2, wherein pulsing the gas mixture further comprises:
    depositing a second portion of the crystalline silicon layer on the substrate.

4. The method of claim 1, wherein applying the RF power at the first mode further comprises:
    ramping up RF power.

5. The method of claim 4, wherein ramping up the RF power further comprises:
    ramping up the RF power from a first predetermined range to a second predetermined range during a period of between 5 seconds and 300 seconds.

6. The method of claim 5, wherein the first predetermined range of RF power has a power density between 0 Watts/cm2 and 2.4 Watts/cm2.

7. The method of claim 1, wherein supplying the gas mixture further comprises:
    supplying the gas mixture into the processing chamber prior to applying the RF power at the first mode.

8. The method of claim 1, wherein the gas mixture includes at least a silicon based gas and a hydrogen based gas.

9. The method of claim 1, wherein applying the RF power at the second mode further comprises:
    pulsing the applied RF power.

10. The method of claim 9, wherein pulsing the applied RF power further comprises:
    pulsing the RF power at every 0.1 seconds to every 60 seconds.

11. A method for forming a crystalline silicon layer, comprising:
   placing a substrate into a processing chamber;
   supplying a gas mixture into the processing chamber;
   applying a RF power at a first mode to the gas mixture;
   pulsing the gas mixture into the processing chamber; and
   applying the RF power at a second mode to the pulsed gas mixture, wherein the RF power at the second mode has a power density ranging from 1.5 Watts/cm2 to 3.5 Watts/cm2, wherein applying the RF power at the second mode further comprises pulsing the applied RF power, and wherein pulsing the applied RF power further comprises:
   pulsing the RF power for between about 10 seconds and about 150 seconds.

12. A method for forming a crystalline silicon layer, comprising:
   placing a substrate into a processing chamber;
   supplying a gas mixture into the processing chamber;
   applying a RF power at a first mode to the gas mixture;
   pulsing the gas mixture into the processing chamber; and
   applying the RF power at a second mode to the pulsed gas mixture, wherein the RF power at the second mode has a power density ranging from 1.5 Watts/cm2 to 3.5 Watts/cm2, and wherein pulsing the gas mixture further comprises:
   synchronously pulsing the RF power at the second mode while pulsing the gas mixture supplied into the processing chamber.

* * * * *